(12) United States Patent
Stierman et al.

(10) Patent No.: US 6,798,212 B2
(45) Date of Patent: Sep. 28, 2004

(54) TIME DOMAIN REFLECTOMETER PROBE HAVING A BUILT-IN REFERENCE GROUND POINT

(75) Inventors: Roger Joseph Stierman, Dallas, TX (US); Charles Anthony Odegard, McKinney, TX (US); Rebecca Lynn Holdford, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 134 days.

(21) Appl. No.: 10/154,564

(22) Filed: May 23, 2002

(65) Prior Publication Data

US 2003/0218463 A1 Nov. 27, 2003

(51) Int. Cl.[7] .................. G01R 31/11; G01R 31/02; G01R 27/32
(52) U.S. Cl. .................. 324/534; 324/754; 324/642
(58) Field of Search .................. 324/533–534, 324/554, 637, 642–643, 688, 754, 644

(56) References Cited

U.S. PATENT DOCUMENTS

| | | | | | |
|---|---|---|---|---|---|
| 3,736,541 A | * | 5/1973 | Gould | .................. | 336/84 R |
| 4,866,302 A | * | 9/1989 | Whiteley et al. | .................. | 327/91 |
| 5,376,888 A | * | 12/1994 | Hook | .................. | 324/643 |
| 6,400,168 B2 | * | 6/2002 | Matsunaga et al. | .................. | 324/754 |
| 6,501,278 B1 | * | 12/2002 | Arabi | .................. | 324/533 |

* cited by examiner

Primary Examiner—Anjan K. Deb
(74) Attorney, Agent, or Firm—Yingsheng Tung; Wade James Brady, III; Frederick J. Telecky, Jr.

(57) ABSTRACT

A probe having a built-in reference plane for use with TDR testing includes a conductive sheet member such as a wire mesh which is attached to a ground input of a TDR system. The conductive sheet is located proximate the tip of the test probe and extends radially from an axis of the test probe thereby providing its own reference ground plane.

17 Claims, 4 Drawing Sheets

TIME DOMAIN REFLECTOMETER PROBE HAVING A BUILT-IN REFERENCE GROUND POINT

FIELD OF THE INVENTION

This invention relates generally to the use of TDR (Time Domain Reflectometry) testing for circuit faults, analysis, extracting and modeling electrical characteristics of interconnects on PCB (Printed Circuit Boards), IC Packages (chip-to-chip, chip-to-board, and board-to-board), subsystems and other semiconductor interconnect circuitry, and more specifically, to a probe having a built-in reference ground plane for quick, consistent TDR measurements for such testing.

BACKGROUND OF THE INVENTION

TDR has traditionally been used to evaluate and test all types of transmission lines, including power lines, telephone, cable TV, optical fibers, etc. However, since substantially any type of electrical connection for transmitting signals is a transmission path or transmission line, the concept is now being used for analyzing and testing connections and signal paths on all types of electronic circuitry including semiconductor circuitry and micro circuitry. As the electrical behavior of a semiconductor package, multichip module, and circuit board interconnect becomes increasingly more important in determining the behavior of digital and analog systems due to the increasing speed and power requirements and decreasing operating voltages of these circuits, TDR testing has become more common. As an example only, one impediment to the development of the next generation of micro processor modules will likely be the lack of power supply stability caused by the interconnects between the micro processor chip, its power supply by-pass capacitor and its power supply voltage regulator. The reason that interconnects are becoming more important for the power supply stability of future micro processors is that power requirements have changed. For example, the power supply voltage is changing from 3.3 volts to 1.1 volts for future systems. Further, the voltage compliance or tolerance requirements are changing from 5% to 2%. Interconnects are also becoming more important for power electronic systems because new power device technologies have increased both the speed and current capacities.

As performance requirements for computer and communication systems grow, the demand for high-speed printed circuit boards (PCBs) and interconnects increases. It is not unusual to find that speeds on the order of 1G bit per second need to be supported by standard printed circuit board technologies. The rise time of these signals can be in excess of 100 PS (Pico Seconds). At these speeds, the relatively short interconnections on printed circuit boards behave as distributed elements or transmission lines, and reflections due to impedance mismatching is a typical signal integrity problem. Vias between layers and connectors on a board create discontinuities that further distort these signals. To accurately predict the propagation of signals on a board, one needs to determine the impedance of the traces on different layers and then extract models for board discontinuities. Time domain reflectometry measurements are the measurement approach of choice for this type of characterization worked. Plus, based on TDR measurements, a circuit board designer can determine characteristic impedance of board traces, compute accurate models for board components and predict board performance more accurately.

A major focus of time domain reflectometry is characterization of interconnect-transmission line properties. With the absence of adequate metrology standards for characterizing interconnects, the electromagnetic wave propagation properties of interconnects are often approximated using analytical or computational methods which do not adequately predict the non-ideal behavior of real interconnects. In these methods, there are some fundamental limitations because the physical properties, parameters and structures of the conductor material are not generally known and an assumption must be made in computations. For example, the transmission line properties of structures such as leads or wire bond interconnects inside device modules or components are almost impossible to calculate accurately because they are physically inaccessible after being packaged. Therefore, a measurement based method such as TDR is ideal for characterizing the transmission line properties of the interconnect parameters. Time domain measurements are also useful because the interconnects cannot be considered as ideal lumped elements (resistors, capacitors and inductors) but must be representative as distributed line elements having transmission line characteristic impedances and propagation delays. In addition, the transmission line characteristics are typically not uniform along the interconnect and therefore must be represented using several transmission line segments having different characteristic impedance and propagation delays.

Of course, the advantages of using TDR may become moot and not be realized if proper connections and circuit setup of the TDR equipment cannot be achieved. Because of small geometries and complexity of some printed circuit boards or IC packages, small probes for contacting selected points or parts on the circuits are used to introduce test signals to the interconnect trace or conductor. Further, it is typically necessary to reference the test signal to a ground plane or suitable reference conductor. Of course, adding ground planes to IC packages and/or PC boards may not even be possible, much less cost effective. Further, choosing a suitable and repeatable reference conductor may also present difficulties for complicated packages or PC boards.

Therefore, it would be advantageous to provide a test probe arrangement where a uniform ground plane is always present and which allows the user to observe the probe as it contacts the circuit under test.

SUMMARY OF THE INVENTION

The present invention discloses a test probe for use with TDR equipment which provides its own uniform ground plane and allows the contact point on the probe to be observed as it is being used. More specifically, a probe for use with a TDR system is disclosed and comprises a support portion or member from a non-electrically conductive material. The support member is typically elongated so as to define an axis between a first end and a contact end. A conductive sheet member such as for example a wire mesh is attached to the support member proximate the contact end. The conductive sheet member is attached to the support member such that it extends away from the axis of the support member. Typically, the conductive sheet member extends substantially radially (that is, the conductive sheet is substantially orthogonal) to the axis. An electrically conductive contact point or portion for contacting a selected location of a conductor or trace under test is supported at the contact end of the support member and is electrically isolated from the conductive sheet. There is also included a first electrical conductor between the conductive contact point or portion and a first electrical input and a second electrical conductor connected between the sheet member and a second electrical input. The first and second electrical conductors may be a coaxial cable. The first electrical input is typically a pulse of a known rise time and direction used in time domain reflectometry, and the conductive sheet such as the wire mesh serves as a built-in uniform reference ground plane. The conductive member, such as a wire mesh, may be selected such that the open areas between the weave or the perforations is sufficient for light to pass through and for a user to observe the end of the contact probe as it is being used. Alternatively, specific apertures may be defined in the conductive sheet member to allow the user to observe the contact point of the probe. The probe is, of course, typically used with a time domain reflectometer system which provides "incident" pulses at the first output with respect to the ground plane. An oscilloscope is typically used to monitor the "incident" pulse and the reflective pulse(s) to analyze the circuit or conductor and/or test for faults.

BRIEF DESCRIPTION OF THE DRAWINGS

The above-mentioned features as well as other features of the present invention will be more clearly understood from consideration of the following description in connection with the accompanying drawings in which.

DESCRIPTION OF PREFERRED EMBODIMENTS

If an electrical conductor or interconnect is proximate or close to at least one other electrical conductor, it can be analyzed and/or tested by TDR measurements. TDR measurements are used to locate and identify faults in all types of electrical conductors and operates in a manner similar to radar. A pulse of energy is transmitted down a conductor and when the pulse reaches the end of the conductor, a connection in the conductor, another circuit element, or a fault along its path, part or all of the pulse energy is reflected back along the conductor toward the source of the pulse. The TDR system measures the time it takes for the signal to travel down the conductor, see the anomaly, and then be reflected along the conductor to a measuring device such as for example an oscilloscope. The TDR system then converts this time to distance and displays the information as a wave form on an oscilloscope or sometimes a digital reading of the distance.

Any time two metallic conductors are placed close together, an impedance is formed between the two conductors. A TDR system looks for a change in this impedance which can be caused by a variety of different circumstances as discussed above, including damage, change in the conductor size, poor solder joints, manufacturing flaws and attached circuit components. The insulating material that keeps the conductors separated may be simply an air gap or an insulative or non-conductive material. The impedance between the two conductors (one of which may be a ground plane on a circuit) is determined by the spacing of the conductors from each other and the type of dielectric used. A TDR measuring system sends incident pulses down the conductor being tested and samples the reflective energy such that any impedance change in the conductor being tested will cause some energy to reflect towards the TDR system providing the incident pulse. The TDR system typically includes an oscilloscope for displaying the incident pulses and the reflected energy. The amount of impedance change determines the amplitude and shape of the reflected energy. Typically, a TDR system will allow the amplitude, duration, and frequency of the incident pulse to be adjusted. The larger the pulse width, the more energy that is transmitted along the conductor and therefore, the further the signal will travel down the conductor.

Figure 1A:
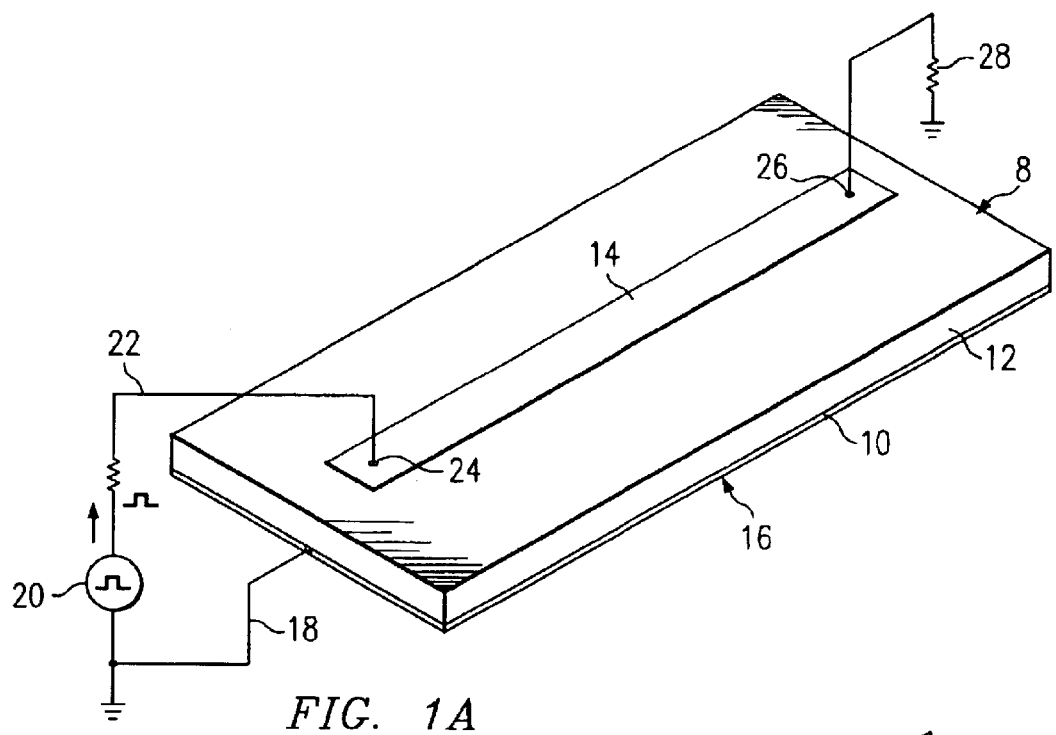
FIGS. 1a and 1b illustrate a typical TDR set up where a suitable ground plane is available for testing a conductor or trace on a circuit.
Figure 1B:
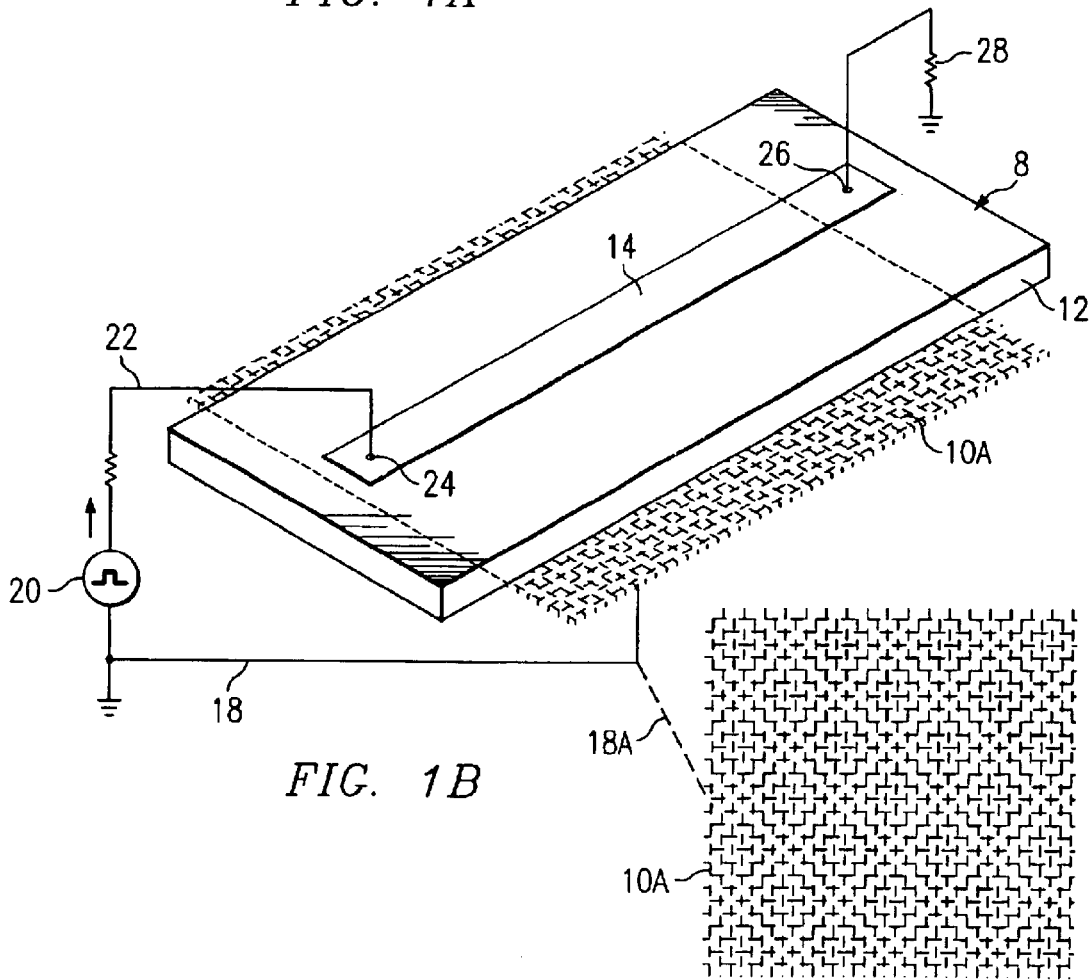

Referring now to FIGS. 1a and 1b, there is shown a typical time domain reflectometry set up for circuit board 8 having a suitable ground plane 10 separated by a dielectric material 12 that may be used for testing or analyzing a circuit interconnect conductor 14 shown on the top surface of the dielectric material 12. In the embodiment shown in FIG. 1a, the ground plane 10 is formed on the bottom side 16 as part of the circuit board 8 itself and is connected to the ground input 18 of the pulse generator 20 of the TDR system. The positive or pulse input connector 22 of pulse generator 20 is connected to the electrical interconnect or conductor 14 under test as illustrated.

FIG. 1b is substantially the same as FIG. 1a, except that the ground plane 10a is not part of the printed circuit board 8 supporting the interconnect conductor 14 under test, but instead is a conductive plate or mesh attached to the ground lead or input 18 of the pulse generator 20 and is simply placed under the support insulating or dielectric material 12, thereby creating a ground plane or conductor suitable for testing the conductive interconnect 14. Conductive woven wire mesh 10a is also shown in FIG. 1b to the side of PCB 8 with a dash line connection 18a as it might be positioned either before or after testing conductor 14. Thus, it will be appreciated as was discussed herein above, an impedance now exists between the ground plane 10 (10A) and the conductor interconnect 14. Thus, when the interconnect conductor 14 and ground plane 10 (10A) are connected to a TDR measurement system, all of the necessary elements are in place and a pulse injected onto the interconnect conductor 14 at the input end 24 will travel along the conductor 14 to the termination end 26. In the embodiment shown, termination end 26 is connected to a suitable resistor 28 which is also connected to the ground as is connection 18 of the pulse generator 20. Although as will be appreciated by those skilled in the art, the termination end 26 of conductor 14 could also be an open circuit rather than being connected to the terminating resistor 28. Further, there could be another conductor attached to the termination end 26 or various circuit components. Appropriate TDR systems will respond to each one of these types of circuit anomalies and provide a reflective signal as discussed above.

Figure 2:
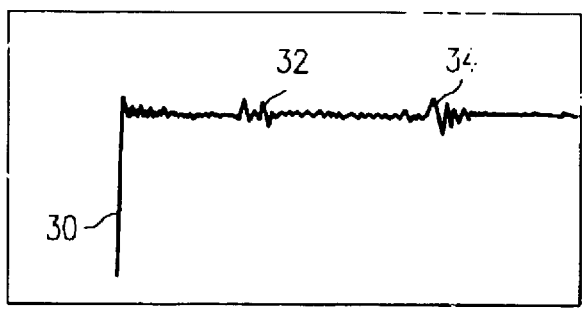
FIG. 2 illustrates an oscilloscope display of a TDR set up according to FIGS. 1a and 1b wherein a probe provides a test pulse to a first end of the conductor or trace.

For example, FIG. 2 illustrates a typical oscilloscope trace that might be displayed when the circuit of FIGS. 1a and 1b are tested. As shown in FIG. 2, there is a pulse incident step 30 in the oscilloscope display representing the "incident" signal first being generated and applied to the conductor 14. This is followed by an indication of a connecting point or connector between the pulse generator 20 input and conductor under test 14 shown by the anomaly 32 in the trace. There is then a length of a reasonably smooth trace representing the length of the electrical conductor 14 until it reaches the terminal end 26 on conductor 14. This is illustrated by the oscilloscope display anomaly 34 where the conductor 14 is connected to the resistor 28. Thus, it can be seen that anomalies or changes in an electrical conductor are readily displayed by TDR analysis so as to indicate changes in circuit impedance. The precision to locate a fault with a TDR signal is dependant on the rise time of the signal. A typical rise time ranges from 10 Pico seconds to 100 Pico seconds.

As was mentioned, the oscilloscope display shown in FIG. 2 is representative of the conductor 14 on printed circuit board 8 being terminated with a resistor 28. As will be appreciated by those skilled in the art, the oscilloscope displays will vary depending upon whether the conductor 14 terminates in an open circuit, a short circuit or some other type of electrical device or anomaly including for example the conductor 14 itself being split or divided or being connected to other conductors.

Figure 3:
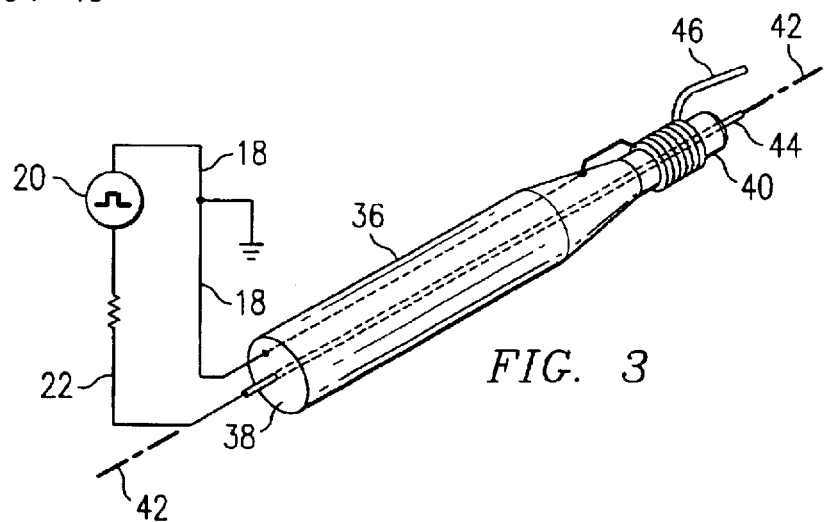
FIG. 3 illustrates a prior art probe having both an input signal contact and a "reference conductor" contact for selecting another trace or conductor on the IC package or printed circuit board as a reference conductor.
Figure 4:
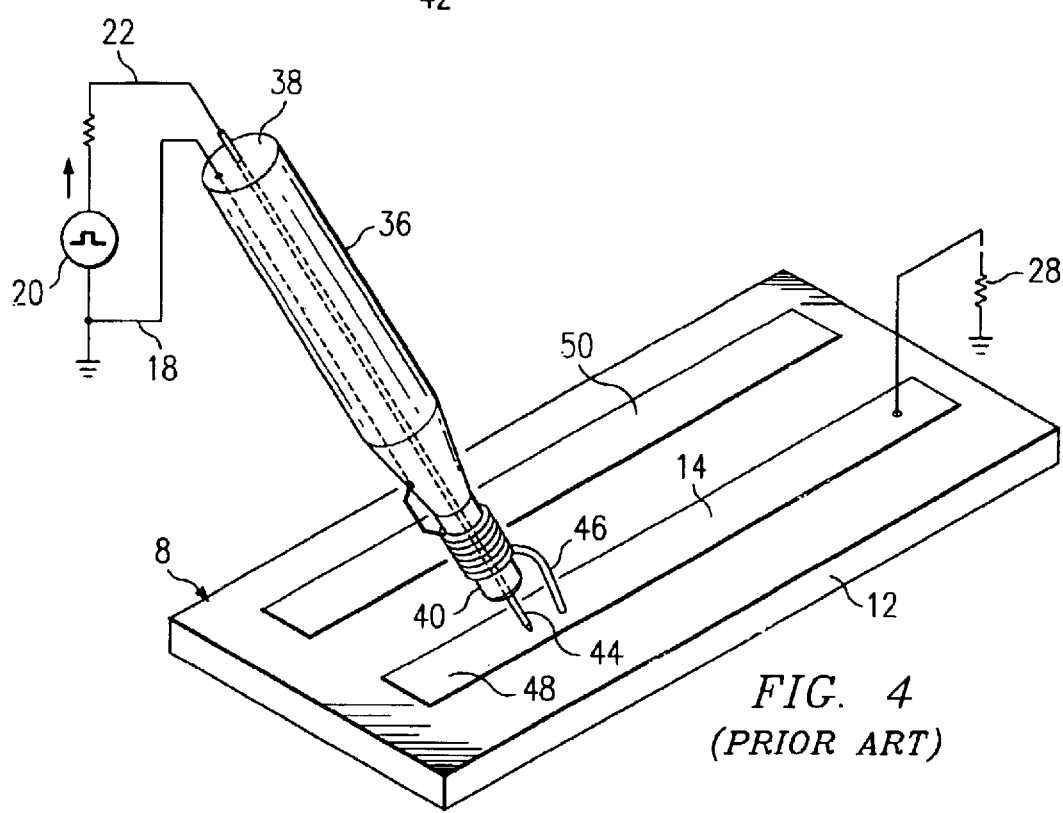
FIG. 4 illustrates a typical TDR set up for use with the probe of FIG. 3 on a circuit board which does not have a ground plane.
Figure 5:
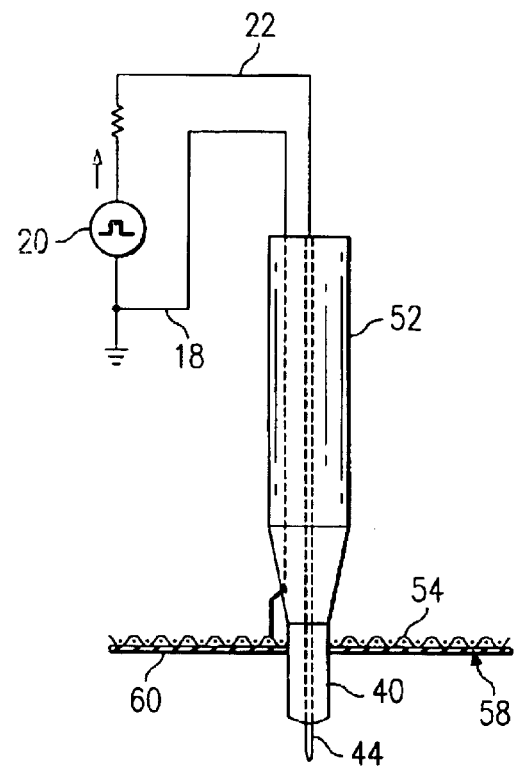
FIG. 5 illustrates a TDR probe incorporating the built-in ground plane feature of the present invention.

However, as will be appreciated by those skilled in the art, a suitable ground plane may not be formed as part of the circuit board under test. Further, it may be difficult to properly place a loose ground plane in a way sufficient to provide satisfactory use of TDR analysis apparatus. Consequently, it is not unusual to analyze or test an interconnect conductor by using a different type of circuit. As was discussed above, any two closely placed electrical conductors may allow the use of TDR analysis instrumentation. For example, referring now to FIG. 3 along with FIG. 4, there is illustrated another set up for testing a conductor on an IC package or printed circuit board. FIG. 3 illustrates a typical prior art TDR probe. As shown, the probe includes an elongated support substrate 36 having an input end 38 and a contact end 40, which define an axis or line of contact 42. As can be seen, there is an electrically conductive point or contact portion 44 which is electrically connected to the pulse input 22 from the pulse generator 20. There is also a second contact point or probe portion 46 which is insulated from the contact portion 44 and is instead connected to the ground input 18 of pulse generator 20. Thus, referring to FIG. 4, it can be seen that the contact point or portion of probe 44 is placed against an input area 48 of the conductor 14 under test while the ground probe portion 46 makes contact with an adjacent conductor on the printed circuit board such as conductor 50. Thus, there is now a reference conductor 50 which may be used in conjunction with the conductor 14 under test to provide the TDR testing or analysis. The set up discussed with respect to FIG. 3 and is of course only satisfactory or suitable when a second conductive member is proximate the conductor 14 which is to be tested. Unfortunately, such conductive elements are not always available and this technique cannot always be used.

Figure 6:
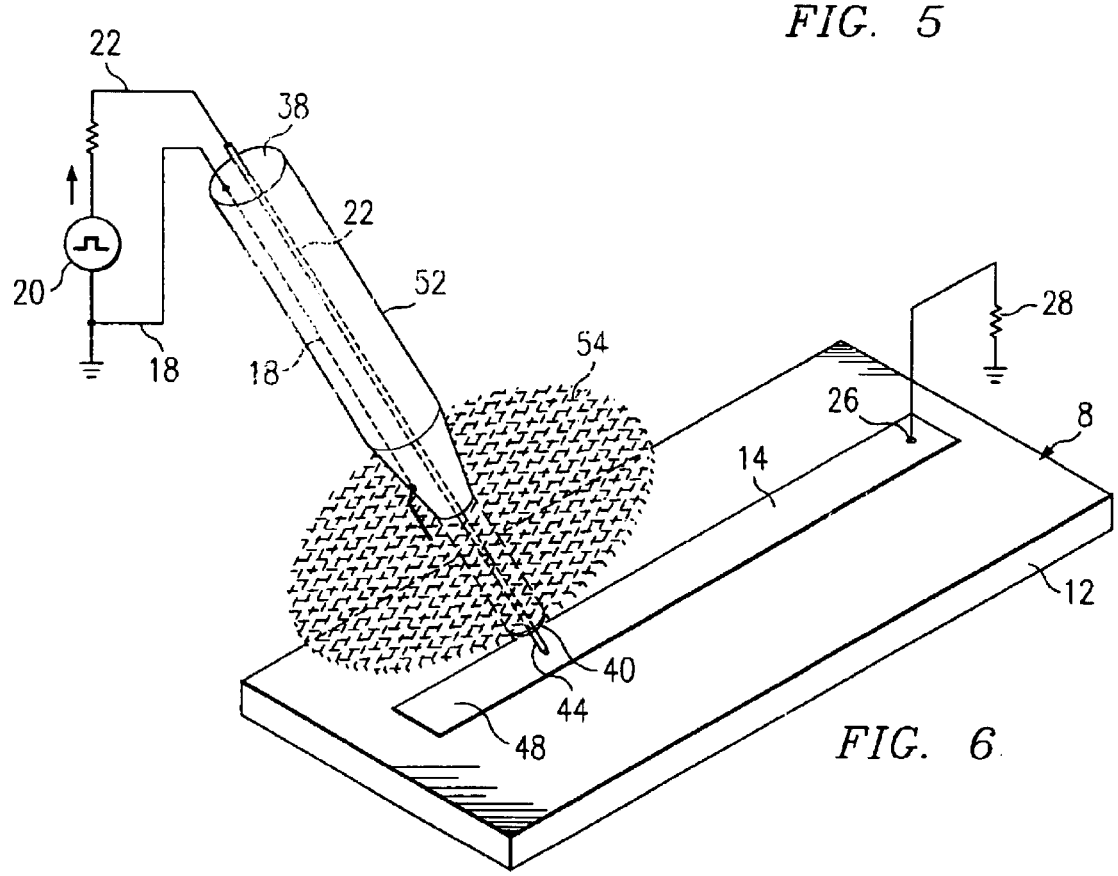
FIG. 6 illustrates an equivalent circuit of a TDR set-up for testing a conductor using a probe of the present invention with a built-in ground plane.

Referring now to FIGS. 5 through 8, there is shown a new probe 52 incorporating the teachings of the present invention (FIGS. 5, 7a, 7b and 8) and the equivalent circuit for testing a conductor using the new probe (FIG. 6). As can be seen, the unique probe 52 of this invention has some similarities to the probe shown in FIG. 3, except that instead of a second or ground probe 46 used for making contact with a selected second conductor on a chip package or PCB, there is now included a conductive sheet 54 such as for example a disk ellipse or other portion of wire mesh attached to the ground input 18 from the pulse generator 20. The center contact portion 44 is connected to input 22 in the same manner as was shown in FIG. 3. Thus, it will be appreciated that the wire mesh or conductive sheet 54 acts as a ground plane with respect to the conductor 14 under test. That is, an impedance is now created between the wire mesh or conductor sheet 54 and the conductor 14 being tested.

Figure 7A:
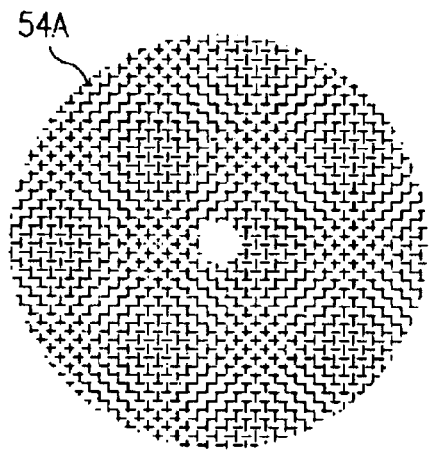
FIGS. 7a and 7b illustrate a circular and elliptical sloped wire mesh built-in ground plane according to the teachings of the invention.
Figure 7B:
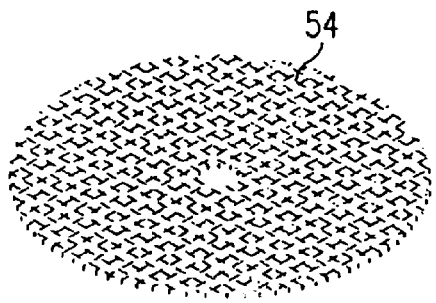
Figure 8:
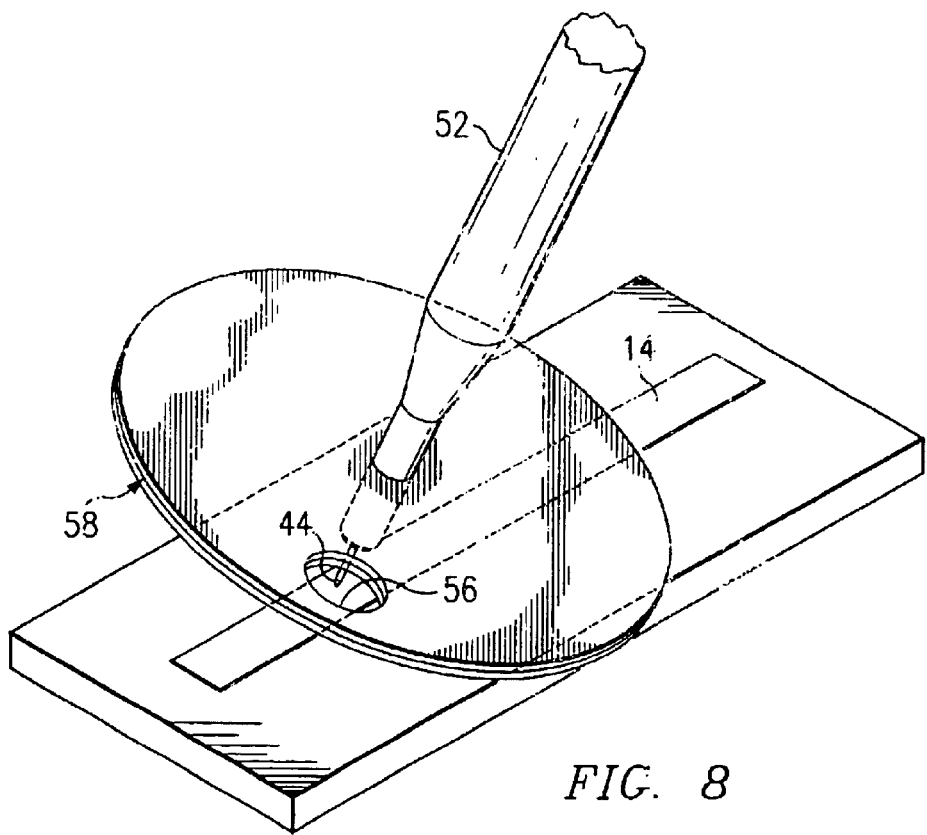
FIG. 8 illustrates a solid conductive sheet with an observation aperture according to another embodiment of the invention.

It will be appreciated that the conductive sheet 54 may be selected to be circular, elliptical or any other suitable shape as illustrated in FIGS. 7a and 7b and is preferably made of a woven wire mesh such that light can pass through the weave of the mesh which allows the user to observe the contact point 44 as it contacts the circuit point under test. In the event of a close weave mesh or a solid conductive sheet or plate as shown in FIG. 8, a perforation may be defined in the conductive sheet as an observation aperture 56 which allows the user to view the contact point 44 through the aperture 56. Finally, it will be appreciated to avoid the possibly of unintended shorts on the circuitry, the under side 58 of the conductive sheet 54 may be coated with a thin film of insulated material 60 (see FIGS. 5 and 8).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A probe for use with a TDR system comprising:
   a support member made from an electrically nonconductive material defining a line of contact and having a first end and a contact end;
   a conductive sheet member attached to said support member approximate said contact end, and said sheet member extending away from said defined line of contact;
   an electrically conductive contact portion for contacting a selected point on a conductor under test, said contact portion supported at said contact end of said support member and electrically isolated from said conductive sheet member;
   a first electrical conductor connected between said conductive contact portion and a first electrical input; and
   a second electrical conductor connected between said conductive sheet member and a second electrical input.

2. The probe of claim 1, wherein said first and second electrical inputs are connected to a signal source and the ground return for said signal source, respectively.

3. The probe of claim 2, wherein said conductive sheet operates as a ground plane.

4. The probe of claim 1, wherein said conductive sheet is a wire mesh.

5. The probe of claim 4, wherein said wire mesh provides a ground plane for ultra high frequency signals.

6. The probe of claim 4, wherein the weave of said wire mesh is sufficiently open to allow light to pass through said mesh such that an area surrounding the end of said contact portion may be observed.

7. The probe of claim 1, herein said conductive sheet extends substantially symmetrical from said defined line of contact.

8. The probe of claim 1, wherein said conductive sheet further defines an observation aperture to allow a user to view the end of the contact probe as it makes contact with a conductor under test.

9. The probe of claim 1, wherein said conductive sheet has a bottom side proximate a conductor under test and a top side, and wherein at least said bottom side is covered by a non-conductive film.

10. A TDR system for testing a interconnecting conductor comprising:
- a signal generator for providing incident pulse outputs with respect to a ground;
- a device for monitoring selected parameters between said incident pulse and a reflective pulse;
- a probe comprising:
  - a support member defining an a line of contact and having a first end and a contact end said support member made from an electrically non-conductive material,
  - a conductive sheet member attached to said support member proximate said contact end, and said sheet member extending away from said defined line of contact,
  - an electrically conductive contact portion for contacting a selected point on said conductor under test, said contact portion supported at said contact end of said support member and electrically insulated from said conductive sheet, and
- a pair of conductors, a first conductor of said pair connected between said incident pulse output and said electrically conductive contact portion, and a second conductor of said conductive pair connected between said conductive sheet member of said probe and said ground.

11. The TDR system of claim 10, wherein said pair of conductors comprise a coaxial cable.

12. The TDR system of claim 10, wherein said pulse signals have a rise time of between about 10 Pico seconds and 100 Pico seconds for testing circuit interconnects.

13. The TDR system of claim 10, wherein said conductive sheet is a wire mesh.

14. The TDR system of claim 13, wherein said conductive sheet provides a ground plane.

15. The TDR system of claim 13, wherein the weave of said wire mesh is sufficiently open to allow light to pass there through such that an area surrounding the contact end of said contact portion may be observed.

16. The TDR system of claim 10, wherein said conductive sheet extends substantially symmetrically away from said defined line of contact.

17. The TDR system of claim 10, wherein said conductive sheet further defines an observation aperture to allow a user to view the end of the probe as it makes contact with a circuit under test.

* * * * *